March 12, 1968 P. D. HANSEN ETAL 3,373,293

TEMPERATURE COMPENSATED FUNCTION GENERATING CIRCUIT

Filed May 21, 1965

INVENTORS:
PETER D. HANSEN
ROBERT H. MALTER
BY
Curtis, Morris & Safford
ATTORNEYS.

United States Patent Office 3,373,293
Patented Mar. 12, 1968

3,373,293
TEMPERATURE COMPENSATED FUNCTION GENERATING CIRCUIT

Peter D. Hansen, Lynnfield, and Robert H. Malter, Sharon, Mass., assignors to George A. Philbrick Researches Inc., Dedham, Mass., a corporation of Massachusetts Filed May 21, 1965, Ser. No. 457,574
7 Claims. (Cl. 307—229)

ABSTRACT OF THE DISCLOSURE

Temperature compensation of diode function generating circuits wherein compensation is achieved by using a semi-conducting junction device (e.g. silicon diode) having temperature characteristics closely matching those of the diode or diodes in the function generating circuits. In one embodiment, a single compensating diode connected to a reference voltage is used for a plurality of function generating circuits.

Figure 1:
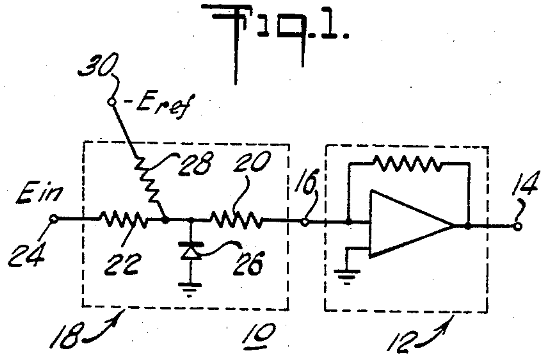

This invention relates to the temperature compensating of an electronic function generating circuit, as used for example in analog computers.

An object of this invention is to provide a function generating circuit which has a high degree of stability in its characteristics over a wide temperature range.

A more specific object is to provide a diode function generating circuit which is stable over a wide temperature range and which operates well from a relatively low supply voltage.

A further object is to provide such a circuit which, while temperature stable and suitable for low voltage, low impedance operation, is nonetheless simple and inexpensive.

These and other objects will in part be understood from and in part pointed out in the following description.

Various function generators are known in the art. Among these is a diode circuit in which segments of the forward conduction characteristic of a number of silicon diodes are added together to generate a portion of a square law function of an analog signal, for example. Typically, a silicon diode begins to conduct in the forward direction above a threshold voltage of about 0.6 volt, thereafter the voltage drop across the diode stays essentially constant at this value and the current through the diode is almost entirely determined by the impedance in the circuit external to the diode.

Because of the intrinsic characteristics of a silicon diode, its threshold voltage shifts with temperature and thus its forward conduction characteristic is dependent upon temperature. For many applications, such as signal rectification, or circuit isolation, this temperature variation is no serious problem. But in computation, where extreme accuracy is necessary, the temperature shift in the conduction characteristic of a diode is intolerable. Previously, this problem has been handled by placing the diode or diodes of the function generator in a constant temperature environment, such as an oven, or by using high supply voltages (e.g. ±100 volts) or both. The present invention eliminates the need of a constant temperature environment and also makes possible the use of much lower voltages, and of low impedances.

The present invention is based upon the realization that it is possible to compensate for the temperature shift of the characteristics of each diode in a function generator by inserting in opposition to that diode a second diode of similar characteristics. The second diode is uniquely arranged in circuit so that the second diode always conducts over the allowable current range of the circuit.

Provided that the two diodes are conducting roughly the same magnitude of current, the temperature sensitivity of the composite circuit is improved by at least ten to one over an uncompensated circuit.

In order to illustrate the simplicity and versatility of the invention we show herein several different types of uncompensated diode segment function generators. Corresponding to each of these we show a compensated circuit embodying the invention.

Figure 3:
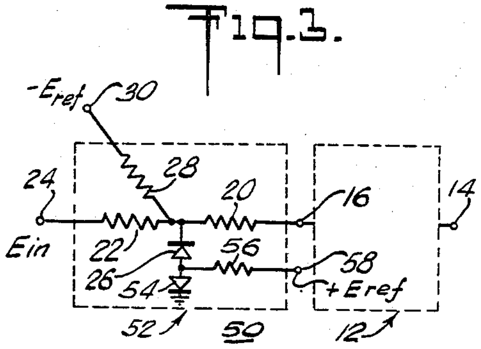
Figure 2:
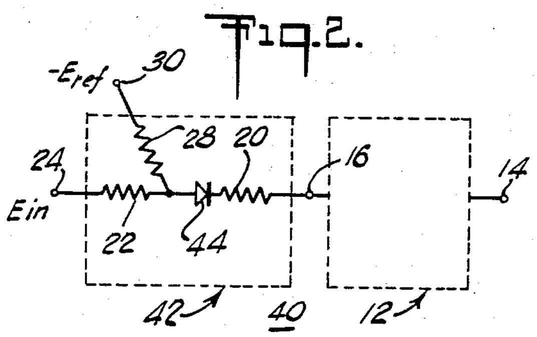
Figure 4:
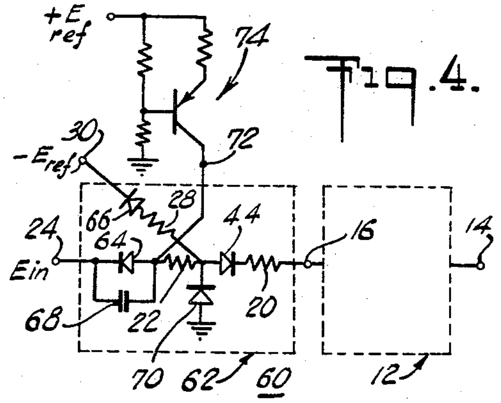
Figure 5:
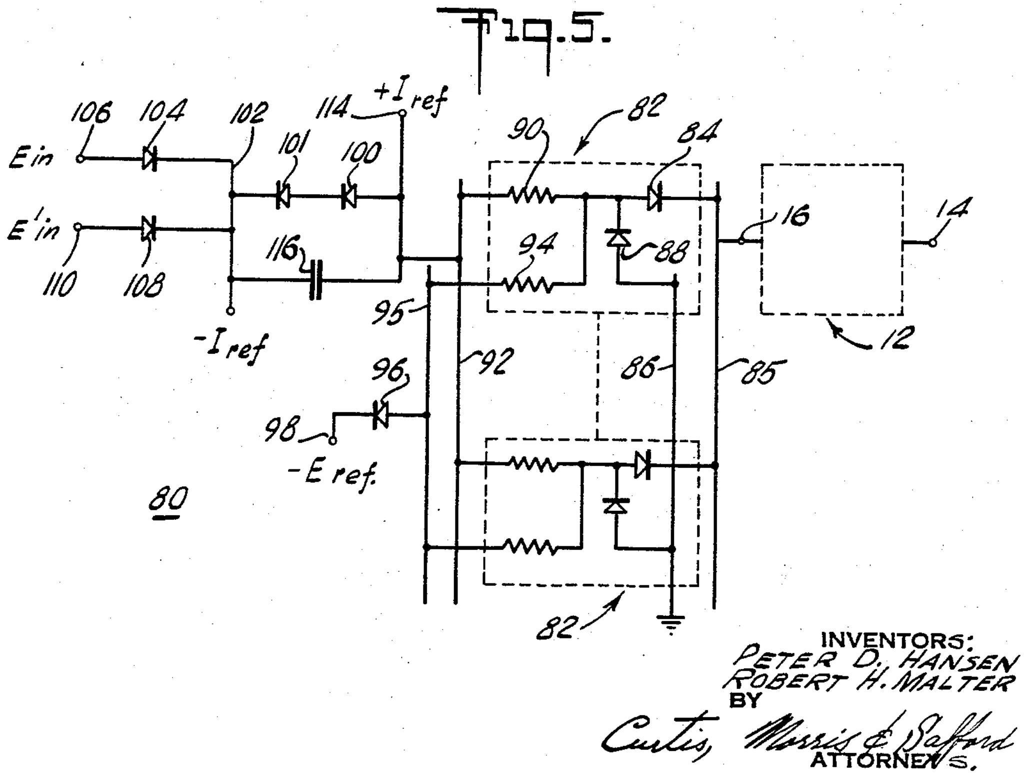

A better understanding of the invention, together with a fuller appreciation of its advantages, will best be gained from the following description given in connection with the accompanying drawings wherein:

FIGURE 1 is a schematic circuit of an uncompensated, shunt type diode segment generator, FIGURE 2 is a circuit of an uncompensated, series type generator, FIGURE 3 is a circuit corresponding to that of FIGURE 1 but which is compensated in accordance with the invention, FIGURE 4 is a circuit corresponding to that of FIGURE 2, but which is compensated in accordance with the invention, and FIGURE 5 is a circuit of a square law diode function generator embodying the invention.

The diode segment function generator 10 shown in FIGURE 1 comprises an operational amplifier, generally indicated at 12, which is known in the art, and which has an output 14 and an input 16. Connected to input 16 is a segment circuit generally indicated at 18. There may for example the a number of these circuits connected to terminal 16, each segment circuit providing a different segment portion of an over-all analog function. Within each circuit is a resistor 20 which in turn is connected via a resistor 22 to a single input terminal 24 common to all of the segment circuits. Shunting the junction of resistors 20 and 22 to ground is a silicon diode 26 which is poled as shown. A bias current is drawn through the diode by connecting to the upper end of it a bias resistor 28 whose other end in turn is connected to a negative reference voltage terminal 30 common to all of the segment circuits 18. Current flows into terminal 16 from each segment circuit when the input signal voltage at terminal 24 exceeds a positive value sufficient to cause diode 26 to turn off. This value of signal voltage, called the "breakpoint" for a circuit 18, is determined by the negative reference voltage applied to terminal 30 multiplied by the ratio of resistor 22 to resistor 28. Above the cut off point of diode 26, current to terminal 16 increases linearly with signal voltage at a rate determined by resistors 20, 22, and 28. A second circuit 18 can have a different "breakpoint" by changing the values of its respective resistors 20, 22, and 28. The precise value of cut off voltage for diode 24 varies as a function of temperature, and this gives rise to errors in the accuracy of function generator 10.

The circuit 40 of FIGURE 2 is similar to the one shown in FIGURE 1. Similar elements have been given the same reference numbers. Here, one or more diode circuits 42 are connected to terminal 16. Each circuit contains in addition to resistors 20, 22, and 28, a silicon diode 44 in series with resistor 20 and poled as shown. Current will flow into terminal 16 from a circuit 42 when the signal applied to terminal 24 reaches a positive value determined by the reference voltage at terminal 30 multiplied by the ratio of resistor 22 to resistor 28. In a circuit 42, resistor 20 can be zero if desired.

FIGURES 3 and 4 show temperature compensated circuits corresponding respectively to the circuits of FIGURES 1 and 2. In each of the compensated circuits of FIGURES 3 and 4, there is a silicon diode in series opposition to the uncompensated diode of FIGURES 1 and 2. The compensating diodes of FIGURES 3 and 4 are biased so that they conduct in the forward direction over the allowable range of input signal voltages for the circuits. Further, the bias currents through the compensating diodes are adjusted so that these currents are not vastly different from the currents flowing through the uncompensated diodes. The current through a compensating diode may for example be ten times greater than the current through the uncompensated diode of a circuit of FIGURES 1 and 2, and yet an improvement of at least ten to one in the temperature stability of the circuit is obtained.

In FIGURE 3, the function generator 50 contains one or more compensated diode circuits 52. Each contains in addition to the elements of a circuit 18 in FIGURE 1, a compensating silicon diode 54 in series with diode 26 but poled in the opposite direction. Diode 54 is connected through a resistor 56 to a positive bias or reference voltage terminal 58. Current flows down through diode 54 over the allowable range of operation of circuit 52.

FIGURE 4 shows a generator 60 in which one or more compensated, series type segment generators 62 are connected to input 16 of amplifier 12. Elements in generator 60 corresponding to those in generator 40 have been given the same reference numbers. The temperature shift in the characteristics of series diode 44 is compensated for by an oppositely poled silicon diode 64 in series with signal input 24 and an oppositely poled silicon diode 66 in series with bias terminal 30. Diode 64 is shunted for A.C. by a capacitor 68. In order to minimize variation of input capacity at terminal 24 when diode 44 ceases to conduct there is connected between its anode and ground a similar diode 70 which is biased so that when diode 44 ceases to conduct diode 70 begins to conduct, and vice versa. A constant bias current is applied to the common connection of diodes 44 and 70 via a reference current terminal 72 from a constant current source generally indicated at 74.

FIGURE 5 shows a square-law function generator 80 in which a number of diode circuits 82 (for example, ten) are connected in parallel to the input 16 of an amplifier 12. Each circuit, by choosing appropriate values for its respective resistors, has a different "breakpoint" and rate of current flow so that a square-law analog function is closely approximated by the over-all combination. Within each circuit 82 is a series diode 84 which is connected to a bus 85 in turn connected to terminal 16. Diode 84 corresponds, for example, to diode 44 in FIGURE 4. Connected between the anode of diode 84 and a ground bus 86 is an impedance compensating diode 88. To the left of diode 84 is an input resistor 90 which is connected to a signal bus 92, and a bias resistor 94 which is connected to a voltage bus 95. The latter is connected through a single diode 96 to a negative reference voltage terminal 98. This single diode, which is poled as shown, serves as part of the temperature compensating arrangement for each and every one of circuits 82.

Signal bus 92 is connected through two diodes 100 and 101 in series to an intermediate input lead 102. The latter is connected through a diode 104 to a first signal input terminal 106 and through a diode 108 to a second signal input terminal 110. This comprises an arrangement for selecting whichever input signal is more positive and for applying it through diodes 100 and 101 to bus 92. In order to keep diodes 100 and 101 conducting, a constant current is drawn from lead 102 at a terminal 112 by a constant current sink, and a constant current is applied to the anode of diode 100 at a terminal 114 from a constant current source. Diodes 100 and 101 are shunted to A.C. by a capacitor 116.

Current which flows to the right through diode 84 is equal to the current to the right through resistor 90 minus the current flowing to the left through resistor 94. Now, by virtue of two diodes 100 and 101 in opposition to diodes 104 and 84 in one current path, and diodes 100 and 101 in opposition to diodes 104 and 96 in another current path, the current applied to bus 85 from a circuit 82 is effectively independent of the voltage drop across any diode. Thus temperature compensation in generator 80, which has a plurality of diode circuits 82, and a selector-type of input, is achieved with only the three diodes 96, 100, and 101.

The above description is intended in illustration and not in limitation of the invention. Various modifications in the embodiments set forth may occur to those skilled in the art, and these modifications may be made without departing from the spirit or scope of the invention as set forth.

We claim:

1. An improved function generator comprising a summing point terminal, and at least one diode segment circuit connected to said terminal, each circuit including a series silicon diode poled for current flow in the forward direction to said terminal, an input terminal, means including an oppositely poled diode connected in series with said series silicon diode and said input terminal, and bias means connected to said circuit to maintain said oppositely poled diode conducting over an allowable range of operation, said bias means including a constant current source connected to the anode of said series silicon diode, and a bias resistor and an oppositely poled diode connected in series with the anode of said series silicon diode and a reference voltage terminal.

2. A temperature compensated function generator comprising a summing point, an intermediate point, an input terminal, a silicon function diode and a resistor connected in series between said summing point and said intermediate point, a first compensating diode and a resistor connected in series between said input terminal and said intermediate point, said function diode and said first compensating diode being oppositely poled, a reference voltage terminal, a second compensating diode and a resistor connected in series between said reference terminal and said intermediate point, and means to apply constant current to the junction of said first compensating diode and resistor.

3. A temperature compensated diode function generator comprising amplifier means, an input terminal and a ground, series resistor means having two end points and an intermediate point, one end point being connected to said terminal, the other end point being connected to said amplifier means, a silicon function diode, silicon semi-conducting junction means in series with said diode and poled for conduction in the opposite direction, said diode and junction means being in series to ground from said intermediate point along said resistor means, and bias means for maintaining said junction means in the conducting state over the allowable range of operation of said generator.

4. The arrangement in claim 3 wherein said junction means comprises a single silicon diode in series with said function diode and oppositely poled relative thereto, one terminal of said silicon diode being connected to ground, the other terminal being connected to said function diode and to said bias means.

5. An improved function generator comprising input means to apply an input signal to a plurality of segment circuits, a summing point output terminal, a plurality of diode segment circuits connected between said terminal and said input means, each circuit respectively including an silicon function diode, an input signal resistor and a bias resistor, said signal resistor and function diode being connected between said input means and said summing point terminal, each circuit having a respective breakpoint, the respective bias resistor of each circuit being connected between its respective function diode and a common reference bus, a single temperature compensating diode connected between said bus and a reference voltage terminal, and means to apply an input signal to all of said segment circuits.

6. The generator in claim 5 wherein said input means to apply an input signal comprises a pair of input signal terminals, a first selector diode connecting one of said signal terminals to an intermediate point, a second selector diode connecting another of said signal terminals to said point, a pair of temperature compensating diodes in series and oppositely poled relative to said first and second selector diodes, said temperature compensating diodes being connected between said point and each input signal resistor of said segment circuits, and means to current bias said pair of compensating diodes.

7. The arrangement in claim 5 wherein in each segment circuit there is a dynamic impedance compensating diode connected to a point between said silicon diode and signal resistor, the other end of said impedance diode being grounded.

References Cited

UNITED STATES PATENTS

| | | | |
|---|---|---|---|
| 3,005,918 | 10/1961 | Judkins | 307—88.5 |
| 3,174,060 | 3/1965 | Schneider et al. | 307—88.5 |
| 3,197,627 | 7/1965 | Lewis | 328—145 X |
| 3,244,867 | 4/1966 | Lavin | 307—88.5 X |

JOHN S. HEYMAN, *Primary Examiner.*

ARTHUR GAUSS, *Examiner.*

J. A. JORDAN, *Assistant Examiner.*